(12) United States Patent
Shiine

(10) Patent No.: US 11,509,267 B2
(45) Date of Patent: Nov. 22, 2022

(54) AMPLIFIER

(71) Applicant: ABLIC Inc., Tokyo (JP)

(72) Inventor: Yuji Shiine, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/072,279

(22) Filed: Oct. 16, 2020

(65) Prior Publication Data

US 2021/0126588 A1 Apr. 29, 2021

(30) Foreign Application Priority Data

Oct. 23, 2019 (JP) .............................. JP2019-192502

(51) Int. Cl.
*H03F 1/26* (2006.01)
*H03F 3/00* (2006.01)

(52) U.S. Cl.
CPC ............... *H03F 1/26* (2013.01); *H03F 3/005* (2013.01); *H03F 2200/271* (2013.01); *H03F 2200/333* (2013.01); *H03F 2203/45551* (2013.01)

(58) Field of Classification Search
CPC ................. H03F 1/26; H03F 2200/333; H03F 2203/45551; H03F 2200/271; H03F 2203/45528; H03F 2203/45138; H03F 2200/261; H03F 3/393; H03F 3/45475; H03F 3/68
USPC ................................... 330/253, 254, 258, 51
See application file for complete search history.

(56) References Cited

U.S. PATENT DOCUMENTS

| 9,899,974 B2 * | 2/2018 | Horiuchi ............. H03F 3/45636 |
| 2014/0312967 A1 | 10/2014 | Nagahisa |
| 2016/0056707 A1 * | 2/2016 | Wong ................... H03H 19/004 323/217 |

FOREIGN PATENT DOCUMENTS

JP 2014-216705 A 11/2014

* cited by examiner

*Primary Examiner* — Samuel S Outten
*Assistant Examiner* — Khiem D Nguyen
(74) *Attorney, Agent, or Firm* — Crowell & Moring LLP

(57) ABSTRACT

An amplifier includes: a signal polarity inversion circuit which modulates an input signal and outputs a modulation signal; an amplifier circuit which is constituted from an operational transconductance amplifier (OTA) to amplify the modulation signal and output a current; and a sample-hold circuit having a sampling capacitor which is charged and discharged by selective sampling of the output current of the amplifier circuit and a holding capacitor to which the voltage of the sampling capacitor is transferred.

2 Claims, 3 Drawing Sheets

AMPLIFIER

RELATED APPLICATIONS

This application claims priority to Japanese Patent Application No. 2019-192502, filed on Oct. 23, 2019, the entire content of which is incorporated herein by reference.

BACKGROUND OF THE INVENTION

1. Field of the Invention

The present invention relates to an amplifier for amplifying small signals.

2. Description of the Related Art

As an amplifier which amplifies small signals, a chopper amplifier is conventionally used widely. FIG. 3 is a block diagram illustrating a conventional chopper amplifier.

The conventional chopper amplifier 20 includes a modulator 21 for chopper-modulating an input signal Vin, a first-stage amplifier circuit 22, a demodulator 23 for chopper-demodulating an amplified signal, a second-stage amplifier circuit 24, and a low-pass filter (LPF) 25.

The conventional chopper amplifier can obtain an amplified signal Vout without low-frequency (1/f) noise by chopper-modulating the input signal Vin at a frequency fc in the modulator 21, chopper-demodulating the signal amplified by the amplifier circuit 22 at the frequency fc in the demodulator 23, amplifying the signal difference in the amplifier circuit 24, and removing high-frequency components by the LPF 25 (for example, see FIG. 5 of Japanese Patent Application Laid-Open No. 2014-216705).

However, in the conventional chopper amplifier, due to the clock feedthrough of switches, which are MOS transistors, that constitute the modulator 21 a noise is superimposed in the input signal Vin and propagates upon modulating the input signal so that a spike noise is mixed in the output voltage of the amplifier circuit 24.

Further, the conventional chopper amplifier needs to include the LPF 25 to remove input error components of the amplifier circuit 22, and the resistance and capacitance of the LPF 25 need to be increased to improve the damping effect, resulting in increase of the chip size.

SUMMARY OF THE INVENTION

It is an object of the present invention to provide an amplifier capable of reducing a spike noise generated by the clock feedthrough of switches without increasing the chip size.

An amplifier according to an embodiment of the present invention includes: a signal polarity inversion circuit which modulates an input signal and outputs a modulation signal; an amplifier circuit constituted from an operational transconductance amplifier (OTA) to amplify the modulation signal and output a current; and a sample-hold circuit having a sampling capacitor which is charged and discharged by selective sampling of the current supplied from the amplifier circuit and a holding capacitor to which a voltage of the sampling capacitor is transferred.

In the amplifier according to the embodiment of the present invention, since the amplifier circuit is constituted from the operational transconductance amplifier (OTA) and the output current of the OTA is sampled and demodulated in the sample-hold circuit, a spike noise generated due to the clock feedthrough of switches can be reduced without increasing the chip size.

DETAILED DESCRIPTION OF THE PREFERRED EMBODIMENTS

Figure 1:
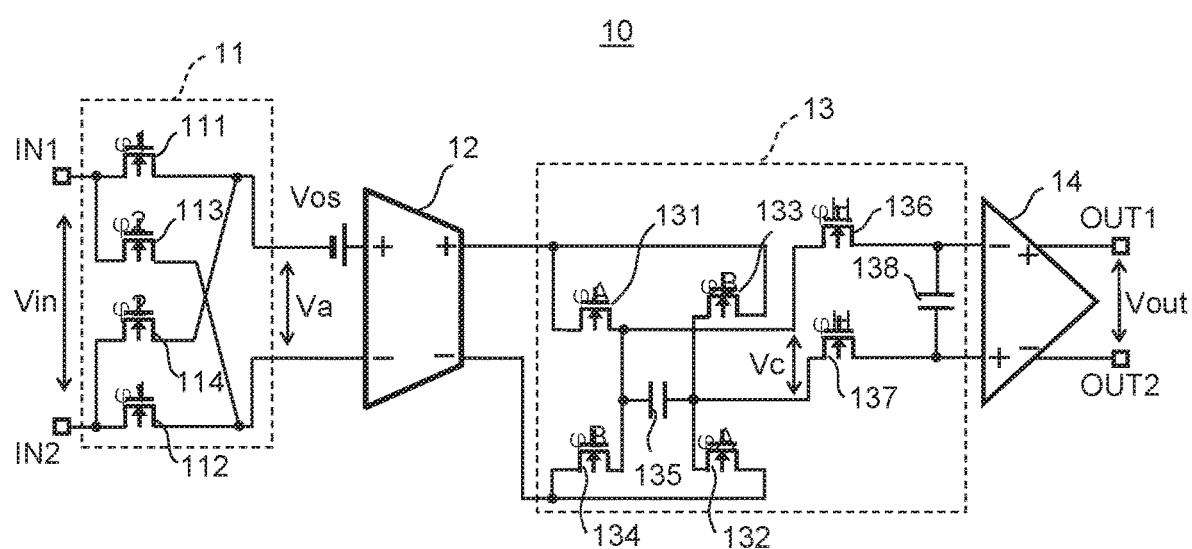
FIG. 1 is a block diagram illustrating an amplifier according to an embodiment the present invention.

FIG. 1 is a block diagram illustrating an amplifier according to the embodiment of the present invention.

The amplifier 10 includes a signal polarity inversion circuit 11, a first-stage amplifier circuit 12, a sample-hold circuit 13, a second-stage amplifier circuit 14, input terminals IN1 and IN2, and output terminals OUT1 and OUT2. The amplifier 10 amplifies an input signal Vin supplied between the input terminals IN1 and IN2, and outputs an output signal Vout between the output terminals OUT1 and OUT2.

The signal polarity inversion circuit 11 has switches 111, 112, 113, 114, a first input terminal, a second input terminal, a first output terminal, and a second output terminal. The amplifier circuit 12 is constituted from an operational transconductance amplifier (OTA). The sample-hold circuit 13 has switches 131, 132, 133, 134, 136, 137, a sampling capacitor 135, a holding capacitor 138, a first input terminal, a second input terminal, a first output terminal, and a second output terminal. The second-stage amplifier circuit 14 is constituted from a fully differential amplifier circuit.

In the signal polarity inversion circuit 11, the input terminal IN1 is connected to the first input terminal and the input terminal IN2 is connected to the second input terminal. The first input terminal is connected to the first output terminal through the switch 111 and connected to the second output terminal through the switch 113. The second input terminal is connected to the second output terminal through the switch 112 and connected to the first output terminal through the switch 114. The signal polarity inversion circuit 11 switches input signals supplied to the first and second input terminals to the first and second output terminals, respectively, in synchronization with control signals φ1, φ2.

The amplifier circuit 12 has the first output terminal of the signal polarity inversion circuit 11 which is connected to the first input terminal, and the second output terminal of the signal polarity inversion circuit 11 which is connected to the second input terminal. The amplifier circuit 12 has an input offset voltage indicated as an offset voltage Vos at the first input terminal as an example.

For a positive difference between the voltage at the first input terminal and the voltage at the second input terminal, the larger the input voltage difference, the larger the current is supplied as source current from the first output terminal and received as sink current from the second output terminal in the amplifier circuit 12. On the other hand, for a negative difference between the voltage at the first input terminal and the voltage at the second input terminal, the larger the input voltage difference, the larger the current is received as sink current from the first output terminal and supplied as source current from the second output terminal. Here, since the amplifier 12 is constituted from an OTA to produce a current as the output signal, the addition or subtraction of the output signal in each period illustrated in FIG. 2 can be easily carried out through the capacitors. In other words, the conventional demodulator can be replaced by the sample-hold circuit.

In the sample-hold circuit 13, the first output terminal of the amplifier circuit 12 is connected to the first input terminal, and the second output terminal of the amplifier circuit 12 is connected to the second input terminal. The first input terminal is connected to one terminal of the capacitor 135 through the switch 131 and connected to the other terminal of the capacitor 135 through the switch 133. The second input terminal is connected to the one terminal of the capacitor 135 through the switch 134 and connected to the other terminal of the capacitor 135 through the switch 132. The one terminal of the capacitor 135 is connected to one terminal of the capacitor 138 through the switch 136 and connected to the first output terminal of the sample-hold circuit 13. The other terminal of the capacitor 135 is connected to the other terminal of the capacitor 138 through the switch 137 and connected to the second output terminal of the sample-hold circuit 13.

The sample-hold circuit 13 has functions to perform sampling by charging, into the capacitor 135, the output current of the amplifier circuit 12 in synchronization with control signals φA and φB, to remove mixed noise components from the output signal of the amplifier circuit 12, and to output the output signal in synchronization with the control signal φH.

The amplifier circuit 14 has a first input terminal to which the first output terminal of the sample-hold circuit 13 is connected, and a second input terminal to which the second output terminal of the sample-hold circuit 13 is connected.

Figure 2:
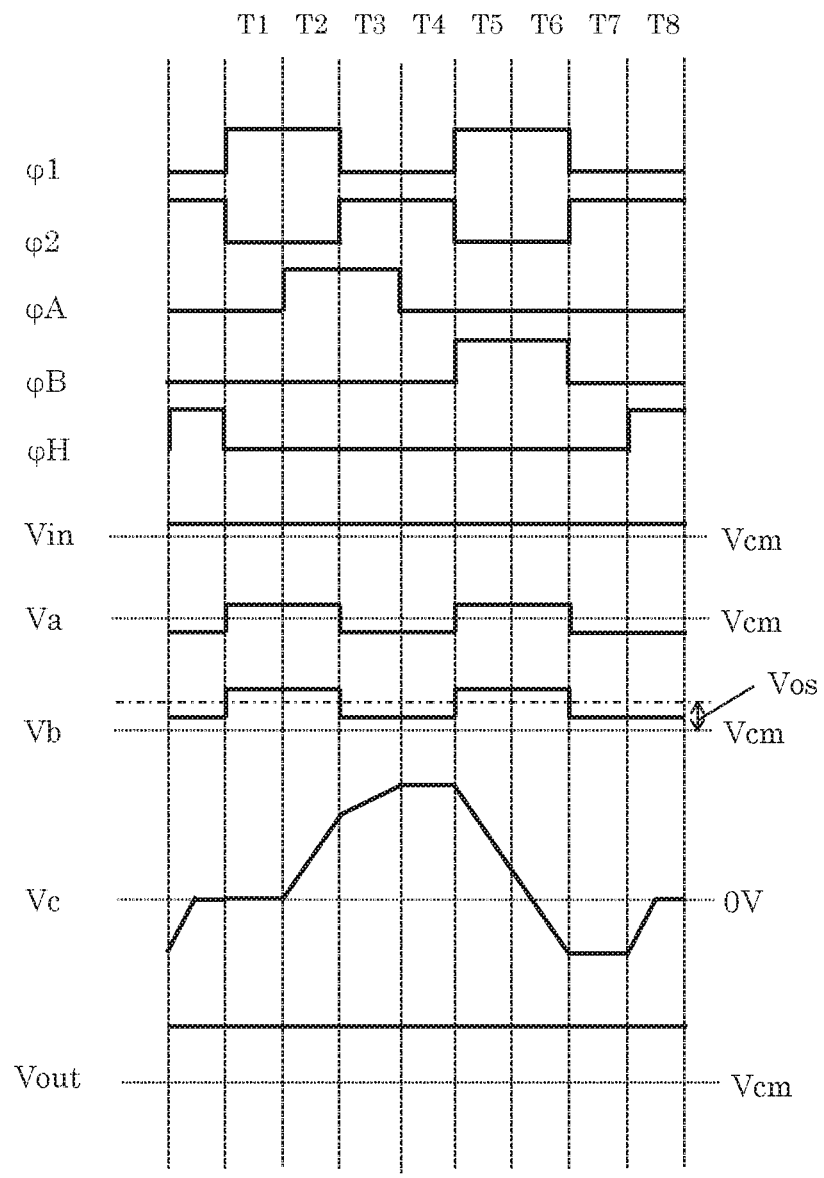
FIG. 2 is a time chart illustrating the operation of the amplifier according to the embodiment of the present invention.
Figure 3:
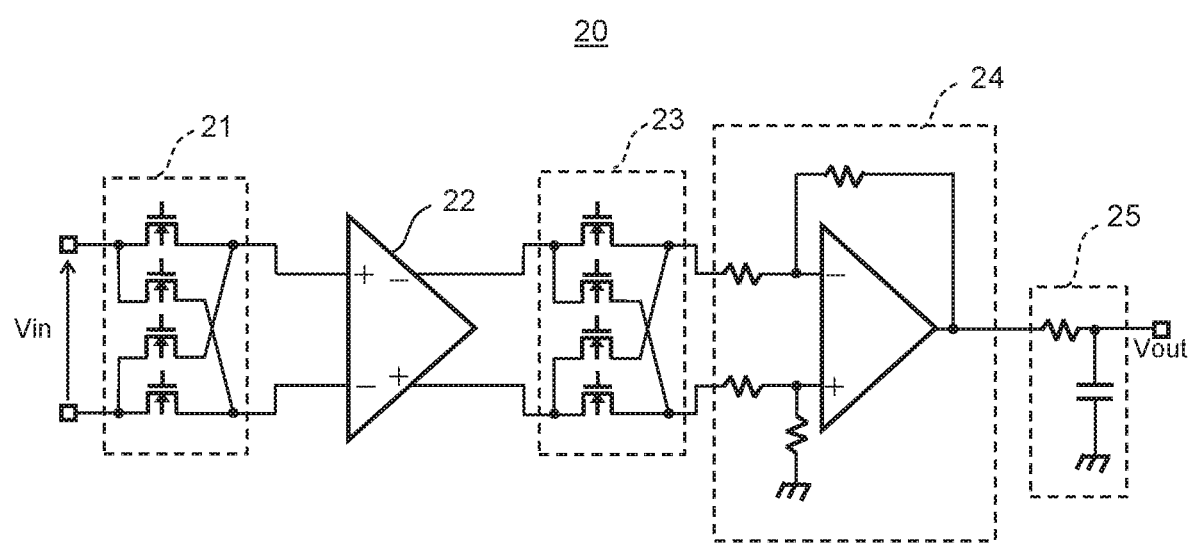
FIG. 3 is a block diagram illustrating a conventional chopper amplifier.

FIG. 2 is a time chart illustrating the operation of the amplifier of the present embodiment.

One cycle of the operation of the amplifier is composed from a period T1 to T8, and the duration of each period is the same (ΔT). Since the frequency of the input signal Vin is sufficiently low compared with the frequencies of control signals φ1, φ2 and the like, the input signal Vin is represented almost as a DC voltage in FIG. 2. Further, Vcm is an operating point voltage of the input signal Vin.

The control signal φ1 is H level during the period T1 to T2 and the period T5 to T6 and is L level during the period T3 to T4 and the period T7 to T8. The control signal φ2 is in levels opposite to those of the control signal φ1. In the signal polarity inversion circuit 11, the first input terminal is thus connected to the first output terminal and the second input terminal is connected to the second output terminal during the period T1 to T2 and the period T5 to T6, and the first input terminal is connected to the second output terminal and the second input terminal is connected to the first output terminal during the period T3 to T4 and the period T7 to T8.

Since the signal polarity inversion circuit 11 operates as described above, the signal Va between the first output terminal and the second output terminal takes a voltage +Vin during the period T1 to T2 and the period T5 to T6 and a voltage −Vin during the period T3 to T4 and the period T7 to T8 around the operating point voltage Vcm. In other words, the signal polarity inversion circuit 11 and the signal Va can be thought of as a modulator and a modulation signal, respectively.

The input voltage, denoted by Vb, between the first input terminal and the second input terminal of the amplifier circuit 12 is obtained by adding the DC offset voltage Vos to the voltage Va. In other words, the voltage during the period T1 to T2 and the period T5 to T6 is +Vos+Vin, and the voltage during the period T3 to T4 and the period T7 to T8 is +Vos−Vin.

Here, denoting the transconductance of the amplifier circuit 12 by gm, the output current of the amplifier circuit 12 is gm×(+Vos+Vin) during the period T1 to T2 and the period T5 to T6, and gm×(+Vos−Vin) during the period T3 to T4 and the period T7 to T8.

During the period T2, in the sample-hold circuit 13, the switch 131 and the switch 132 are turned on because the control signal φA is in H level and the switch 133 and the switch 134 are turned off because the control signal φB is in L level. In other words, the first input terminal is connected to the one terminal of the capacitor 135 through the switch 131, and the second input terminal is connected to the other terminal of the capacitor 135 through the switch 132.

Further, since the control signal φH is in L level, the switch 136 and the switch 137 are turned off. In other words, the capacitor 138 is disconnected from the capacitor 135.

As a result, the capacitor 135 is charged with an output current (gm×(+Vos+Vin)) of the amplifier circuit 12 during the time duration ΔT. A voltage VCst2 of the capacitor 135 at the end of the period T2 is expressed by Equation (1) where the capacitance of the capacitor 135 is denoted by Cs.

$$VCst2 = \frac{gm \times (Vos + Vin)}{Cs} \times \Delta T \quad (1)$$

Afterward, during the period T3, the capacitor 135 of the sample-hold circuit 13 is charged with an output current (gm×(+Vos−Vin)) of the amplifier circuit 12 during the time duration ΔT. A voltage VCst3 of the capacitor 135 at the end of the period T3 is thus expressed by Equation (2).

$$VCst3 = \frac{gm}{Cs} \times Vos \times 2\Delta T \quad (2)$$

As is clear from Equation (2), the capacitor 135 is charged during the period T2 to T3 to a voltage based on the offset voltage Vos separated from the input signal Vin by adding the current based on the input voltage Vin during the period of the inverted polarity.

During the period T4, since both the control signals φA, φB are L level, the switch 131 to the switch 134 are all turned off and the capacitor 135 holds the voltage of Equation (2).

At the beginning of the period T5, since the control signal φB becomes H level, the switch 133 and the switch 134 are turned on. In other words, the capacitor 135 is connected to the output terminals of the amplifier circuit 12 in a manner opposite to the case in the period T3.

During the period T5 to T6, since the control signal φ1 is H level and the control signal φ2 is L level, the amplifier circuit 12 outputs the current (gm×(+Vos+Vin)). Then, since the switch 133 and the switch 134 are turned on, the capacitor 135 is discharged with the current (gm×(+Vos+Vin)) during the time duration 2ΔT.

A voltage VCst6 of the capacitor 135 at the end of the period T6 is thus expressed by Equation (3).

$$VCst6 = -\frac{gm}{Cs} \times Vin \times 2\Delta T \quad (3)$$

As expressed in Equation (3), the sample-hold circuit 13 operates during the period T2 to T6 to remove the noise component from the output signal of the amplifier circuit 12 and extracts only the amplified signal component of the input signal Vin through sampling by charging and discharging of the capacitor 135.

During the period T7, since both the control signals φA, φB are L the switch 131 to the switch 134 are all turned off and the capacitor 135 holds the voltage of Equation (3).

At the beginning of the period T8, since the control signal φH becomes H level, the switch 136 and the switch 137 are turned on. In other words, the voltage of the capacitor 135 is transferred to the capacitor 138 and supplied as the output signal Vout to the output terminals OUT1 and OUT2 of the amplifier through the amplifier circuit 14.

At the end of the period T8, since the control signal φH becomes L level, the switch 136 and the switch 137 are turned off, and the series of operations ends. The amplifier of the present embodiment repeats the operations to amplify the input signal Vin in order to output a low-noise output signal Vout.

As described above, since the amplifier of the present embodiment includes the first-stage amplifier circuit 12 constituted from an OTA and the sample-hold circuit 13, spike noise generated due to the clock feedthrough of switches (MOS transistors) that constitute the signal polarity inversion circuit 11 does not propagate to the subsequent-stage amplifier circuit 14. Since there is no need to provide an LPF after the amplifier circuit 14, the chip size does not increase.

While an embodiment of the present invention has been described above, the present invention is not limited to the embodiment. Various changes can be made without departing from the scope of the present invention.

For example, the polarities of the input terminals and the output terminals of the amplifier circuit 12 and the amplifier circuit 14 may be designed as appropriate. Further, for example, the amplifier circuit 14 may be omitted if it is not necessary.

What is claimed is:

1. An amplifier comprising:

a signal polarity inversion circuit configured to modulate an input signal and output a modulation signal;

an amplifier circuit constituted from an operational transconductance amplifier configured to amplify the modulation signal and output a current; and a sample-hold circuit, having a sampling capacitor which is charged and discharged by selective sampling of the current supplied from the amplifier circuit and a holding capacitor to which a voltage of the sampling capacitor is transferred, wherein:

the amplifier operates from a first period to an eighth period as one cycle, the signal polarity inversion circuit does not invert the input signal in the first, a second, a fifth, and a sixth periods, and inverts the input signal in a third, a fourth, a seventh, and the eighth periods to output the modulation signal, and the sample-hold circuit charges and discharges the sampling capacitor through sampling of the modulation signal in the second, the third, the fifth, and the sixth periods, and transfers a voltage of the sampling capacitor to the holding capacitor in the eighth period.

2. The amplifier according to claim 1, wherein the signal polarity inversion circuit modulates the input signal based on a first control signal and a second control signal, and the sample-hold circuit selectively charges and discharges the current supplied from the amplifier circuit based on a third control signal and a fourth control signal to the sampling capacitor through sampling, and transfers a voltage of the sampling capacitor to the holding capacitor based on a fifth control signal.

\* \* \* \* \*